United States Patent
Jeon et al.

(10) Patent No.: US 7,486,573 B2
(45) Date of Patent: *Feb. 3, 2009

(54) FLASH MEMORY DEVICE AND VOLTAGE GENERATING CIRCUIT FOR THE SAME

(75) Inventors: Hong-Soo Jeon, Suwon-si (KR); Dae-Han Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 132 days.

This patent is subject to a terminal disclaimer.

(21) Appl. No.: 11/520,803

(22) Filed: Sep. 14, 2006

(65) Prior Publication Data

US 2007/0081391 A1    Apr. 12, 2007

(30) Foreign Application Priority Data

Oct. 12, 2005    (KR) .................... 10-2005-0096082

(51) Int. Cl.
*G11C 5/14* (2006.01)
(52) U.S. Cl. .................... 365/189.09; 365/226; 365/229
(58) Field of Classification Search ............ 365/189.01, 365/189.09, 226, 229
See application file for complete search history.

(56) References Cited

U.S. PATENT DOCUMENTS

| 6,529,411 B2 | 3/2003 | Tonda et al. |
| 6,704,224 B2 * | 3/2004 | Natori .................... 365/185.18 |
| 7,019,730 B2 * | 3/2006 | Tsuchiya .................... 345/98 |

FOREIGN PATENT DOCUMENTS

| JP | 2002-170391 | 6/2002 |
| JP | 2003-217287 | 7/2003 |
| JP | 2003-249086 | 9/2003 |
| KR | 1020020071703 A | 9/2002 |

* cited by examiner

*Primary Examiner*—VanThu Nguyen
(74) *Attorney, Agent, or Firm*—Volentine & Whitt, PLLC

(57) ABSTRACT

A flash memory device may include a memory cell array. The memory cell array may include a plurality of memory cells. The flash memory device may also include a voltage generator which generates a plurality of constant voltages. The voltage generator may comprise of a plurality of voltage regulators, wherein each voltage regulator is configured to divide a high voltage generated from a charge pump to generate at least two constant voltages having a constant voltage difference therebetween. The plurality of voltage regulators may have independent voltage dividing paths, wherein each path is configured to generate a separate constant voltage.

18 Claims, 7 Drawing Sheets

FLASH MEMORY DEVICE AND VOLTAGE GENERATING CIRCUIT FOR THE SAME

BACKGROUND OF THE INVENTION

1. Field of the Invention

The present invention relates generally to a semiconductor memory device and, more particularly, to a flash memory device and a voltage generating circuit for the same.

2. Description of the Related Art

Semiconductor memories are usually considered to be the most vital microelectronic component of digital logic system design. Semiconductor memories may be used in various fields such as, for example, computers, microprocessor-based applications ranging from satellites to consumer electronics, etc. Because of the large usage of semiconductor memories in various fields, there is a need and value associated with innovations in the field of semiconductor memory fabrication. Some of these innovations may include enhancements in the semiconductor fabrication process and technology that may lead to an increase in the density and processing speed of semiconductor memories.

Generally, semiconductor memory devices may be classified into volatile memory devices and non-volatile memory devices. The volatile memory devices may be classified into dynamic random access memories (DRAMs) and static random access memories (SRAMs). Volatile memory devices may suffer from some limitations. For example, volatile memory devices may lose their data when their power supplies are interrupted. On the other hand, non-volatile memory devices may retain their stored data even when their power supplies are interrupted. Therefore, non-volatile memories may be widely used to store data that has to be retained irrespective of power supply interruption. Non-volatile memory may include, for example, mask read-only memories (MROMs), programmable read-only memories (PROMs), erasable programmable read-only memories (EPROMs), and electrically erasable programmable read-only memories (EEPROMs).

Flash memory devices may be categorized as NOR-type and NAND-type flash memory. This categorization is based on the arrangement of memory cells. Specifically, in a NOR-type flash memory device, at least two cell transistors are connected in parallel to a bitline and data may be stored by means of a channel hot electron and erased by means of Fowler-Nordheim tunneling (F-N tunneling).

On the other hand, a NAND-type flash memory device may include at least two cell transistors connected in series to a bitline. Furthermore, the data is stored and erased by means of F-N tunneling. NOR-type flash memory devices may have certain limitations. For example, an increase in their integration density may cause an increase in power consumption. However, a NOR-type flash memory may perform well at high operating speeds. In recent years, multi-level cell (hereinafter referred to as "MLC") technologies have been used to increase the integration density of NOR-type flash memory devices.

FIG. 1 illustrates threshold voltages of a flash memory cell and the distributions of corresponding data. Specifically, FIG. 1 illustrates threshold voltage distributions of an MLC in which 2-bit data is stored and where the data values correspond to respective threshold voltages.

For example, when single-bit data is stored in a flash memory, data stored in a unit cell may be expressed as two threshold voltage distributions each, corresponding to data '1' and data '2'. Alternatively, when multi-bit data is stored in a flash memory device, data stored in a unit cell may be expressed by four threshold voltage distributions each corresponding to data '11', data '10', data '00', and data '01', as illustrated in FIG. 1. Values of data stored in a cell may be arranged as follows: '11', '10', '00,' and '01'. In this case, the values may be arranged according to the descending order of states of a cell threshold voltage. In general, the state '11' is an erased state and a program operation starts from the state '11'.

A plurality of constant voltages are required for programming, erasing, and reading single-bit/multi-bit data to/from a flash memory cell. The constant voltages are generated from a voltage generating circuit. Among the constant voltages, program verify voltages Vvrf0, Vvrf1, Vvrf2, and Vvrf3, and read voltages Vread1, Vread2, and Vread3 are shown in FIG. 1. The voltages shown in FIG. 1 are merely part of a set of constant voltages generated from a voltage generating circuit. As is well known in the art, with an increase in the bit number of data stored in each cell, more levels of a wordline voltage may be required for programming, erasing, and reading the stored data.

Generally, each constant voltage may be generated through an independent charge pump and an independent regulating circuit. However, using a separate charge pump to generate separate voltage levels may pose some problems. For example, an additional control signal may be required for generating and maintaining each constant voltage. Furthermore, an additional circuit may also be required for controlling the additional control signal. Therefore, as levels of a wordline voltage increase in number, the configuration of a circuit required for generating each voltage may become complex and the chip size may have to be increased to accommodate the increase in the number of circuits. Moreover, the characteristics of each regulating circuit may vary because of the difference in the process of designing and fabricating each circuit. This difference in fabrication and/or design processes may lead to an increase in the difference between the voltages generated by each regulating circuit. Therefore, a sensing margin used to determine the data stored in the cells may be reduced.

SUMMARY OF THE INVENTION

One aspect of the disclosure includes a flash memory device. The flash memory device may include a memory cell array. The memory cell array may include a plurality of memory cells. The flash memory device may also include a voltage generator which generates a plurality of constant voltages. The voltage generator may comprise of a plurality of voltage regulators, wherein each voltage regulator is configured to divide a high voltage generated from a charge pump to generate at least two constant voltages having a constant voltage difference therebetween. The plurality of voltage regulators may have independent voltage dividing paths, wherein each path is configured to generate a separate constant voltage.

Another aspect of the present disclosure includes a voltage generating circuit. The voltage generating circuit may include a charge pump which generates a voltage higher than a power supply voltage with a charge pumping operation. The voltage generating circuit may also include a first-type voltage regulator which divides the voltage generated from the charge pump to generate a plurality of control signals. The voltage generating circuit may also include a plurality of second-type voltage regulators, wherein each of the plurality of voltage generators divides the voltage generated from the charge pump to generate at least two constant voltages having a constant voltage difference therebetween. The voltage generating circuit may also include a control circuit which controls the charge pumping operation in response to at least one of the plurality of control signals. The voltage regulators may have independent voltage dividing paths, wherein each path is configured to generate a separate constant voltage.

DETAILED DESCRIPTION OF EXEMPLARY EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

In an exemplary embodiment of a flash memory device, a plurality of read voltages and verify voltages may be generated by using a single charge pump. However, the voltage dividing paths for voltage generation may be formed independently in the flash memory device. Therefore, it may be possible to reduce the effect of charge coupling arising from the respective read voltages and the respective corresponding verify voltages. Furthermore, because the read voltages and the verify voltages generally use a reference voltage (i.e., an output of the charge pump), the recovery time and setup time for a verify voltage may not be required at all.

Figure 2:
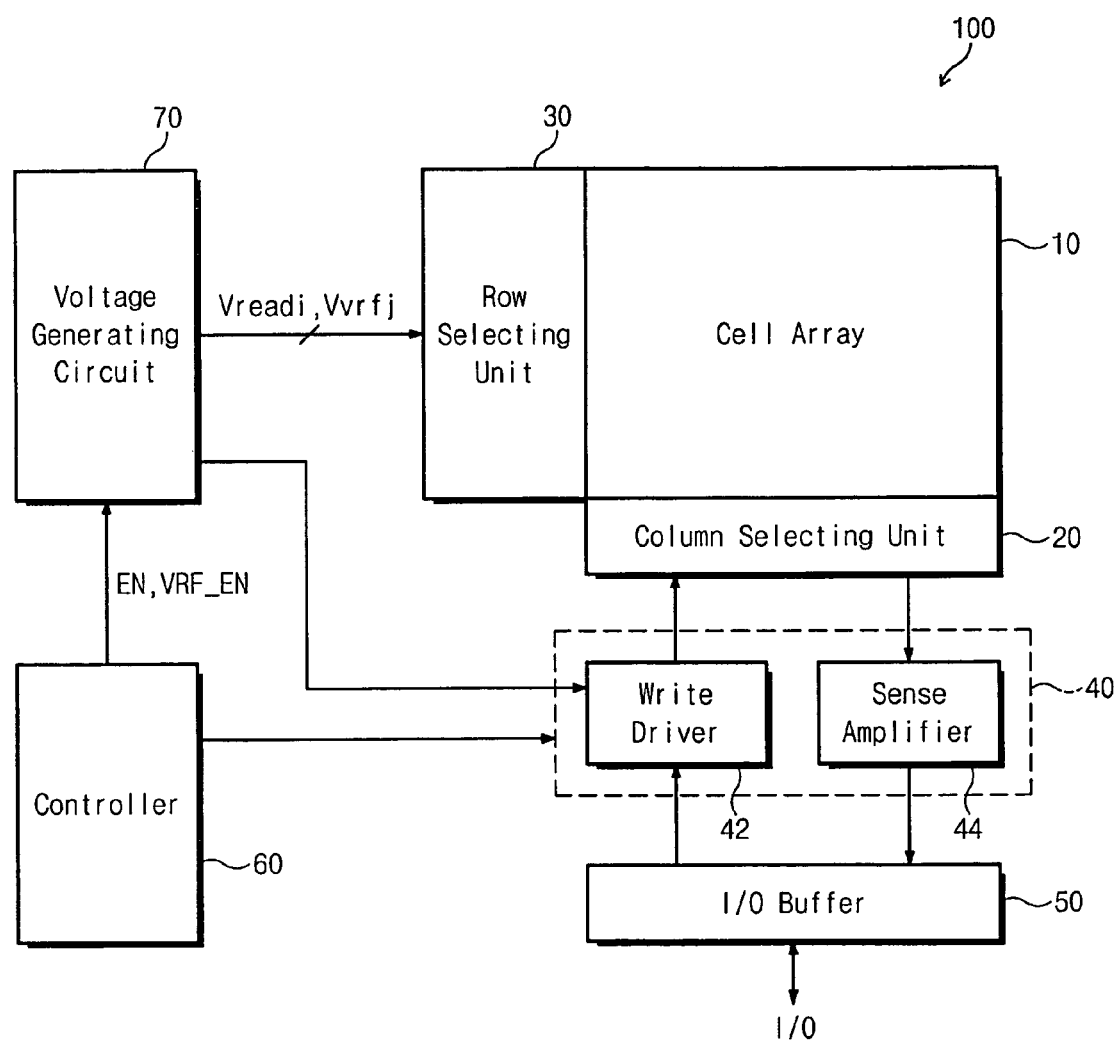
FIG. 2 is a block diagram of a flash memory device according to an exemplary disclosed embodiment.

FIG. 2 provides a block diagram representation of a flash memory device 100. The flash memory device 100 may include a NOR-type flash memory device adopting, for example, the MLC data storage technology. The flash memory device 100 may include a memory cell array 10, a column selecting unit 20, a row selecting unit 30, a data input/output circuit 40, an input/output buffer (I/O buffer) 50, a controller 60, and a voltage generating circuit 70.

The memory cell array 10 may include a plurality of memory cells arranged at intersections of rows (wordlines) and columns (bitline). The voltage generating circuit 70 may generate a plurality of constant voltages used in program, erase, and read operations for a memory cell. The voltage generating circuit 70 may share a charge pump for generating a read voltage $Vread_i$ and a program verify voltage $Vvrf_j$. Furthermore, the voltage generating circuit 70 may generate the read and verify voltages through independent voltage dividing paths. In an exemplary embodiment, corresponding read and program verify voltages $Vread_i$ and $Vvrf_j$, may be obtained by dividing a high voltage generated from the same charge pump to generate a constant voltage through separate voltage dividing paths. Thus, a constant voltage difference may be maintained between corresponding read and program verify voltages $Vread_i$ and $Vvrf_j$. Furthermore, the independent voltage dividing paths may reduce an interaction between a read voltage Vreadi and a program verify voltage $Vvrf_j$.

A read voltage $Vread_i$ of a standby state or an active state may be generated depending on whether an enable signal EN is activated. Similarly, the voltage generating circuit 70 may selectively generate a program verify voltage $Vvrf_j$ depending on whether a verify enable signal VRF_EN generated from the controller 60 is activated. That is, the voltage generating circuit 70 may not continuously generate a program verify voltage $Vvrf_j$ even during an active period, but instead, may generate the same at a period where a program verify operation is conducted. This may reduce the current loss at a charge pump. Because each program verify voltage $Vvrf_j$ has a smaller capacitor element than the read voltage $Vread_i$, program verify voltage $Vvrf_j$ need not be divided into a program verify voltage $Vvrf_j$ of a standby state and a program verify voltage $Vvrf_j$ of an active state. Nonetheless, such a characteristic of the program verify voltage $Vvrf_j$ is merely exemplary and the program verify voltage $Vvrf_j$ may be divided into a program verify voltage $Vvrf_j$ of a standby state and a program verify voltage $Vvrf_j$ of an active state.

In an exemplary embodiment, each read voltage $Vread_i$ generated from the voltage generating circuit 70 may be regulated to have a constant level through a feedback loop. Furthermore, an output node outputting a read voltage of a standby state and an output node outputting a read voltage of an active state may be commonly connected. This common connection may be used to co-regulate voltage levels of the two different states. Thus, there may be no need for level regulation even if an operation state of the flash memory 100 changes from a standby state to an active state. Instead, the read voltage $Vread_i$ generated from the voltage generating circuit 70 may be directly applied to a corresponding wordline.

The row selecting unit 30 may select one of the constant voltages generated from the voltage generating circuit 70 and may apply the selected voltage to a corresponding wordline. The row selecting unit 30 may also select a bitline to which a cell to be programmed (or read out) is connected, among a plurality of cells included in a selected wordline.

The I/O buffer 50 may store data to be programmed to the memory cell array 10 and data to be sensed from the memory cell array 10. The data input/output circuit 40 may include a write driver 42 and a sense amplifier 44. The write driver 42 may receive data to be programmed from the I/O buffer 50. This received data may be used to program a selected memory cell. The sense amplifier 44 may sense data programmed to a selected memory cell. The data sensed by the sense amplifier 44 may be stored in the I/O buffer 50. The controller 60 may control general operations associated with program, erase, and read operations of the flash memory device 100.

For the convenience of description, only the configuration of the voltage generating circuit 70 for generating a read voltage and a program verify voltage will now be described below. In addition, generation of the other voltages (e.g., a program voltage, an erase voltage, an erase verify voltage, etc.) will not be described below.

Figure 3:
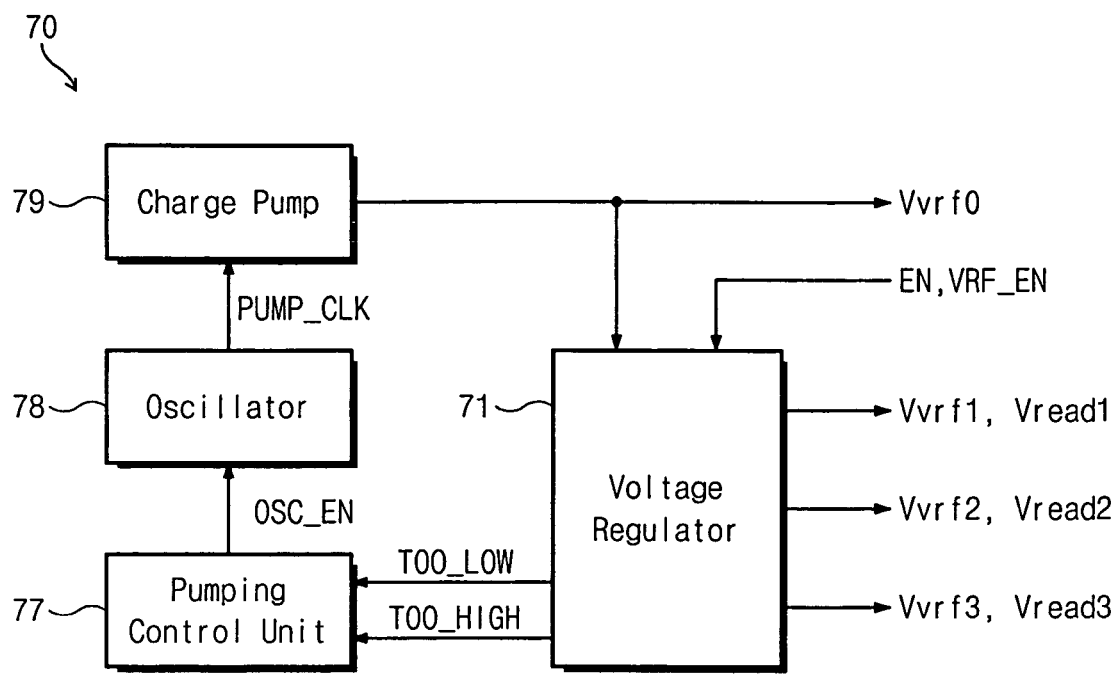
FIG. 3 is a block diagram of a voltage generating circuit illustrated in FIG. 2 according to an exemplary disclosed embodiment.

FIG. 3 is a block diagram representation of the voltage generating circuit 70 illustrated in FIG. 2. Specifically, FIG. 3 illustrates the configuration of a voltage generating circuit 70 for MLC where 2-bit data is stored in a cell. As illustrated in FIG. 3, the voltage generating circuit 70 may include a voltage regulator 71, a pumping control unit 77, an oscillator 78, and a charge pump 79.

The charge pump 79 may generate a higher voltage Vvrf0 than a power supply voltage. The voltage regulator 71 may divide the voltage Vvrf0 in response to an enable signal EN and a verify enable signal VRF_EN generated from the controller 60. The voltage dividing result may be used to generate a plurality of read voltages Vread1, Vread2, and Vread3, a plurality of program verify voltages Vvrf1, Vvrf2, and Vvrf3, and to control a pumping operation of the charge pump 79.

Figure 1:
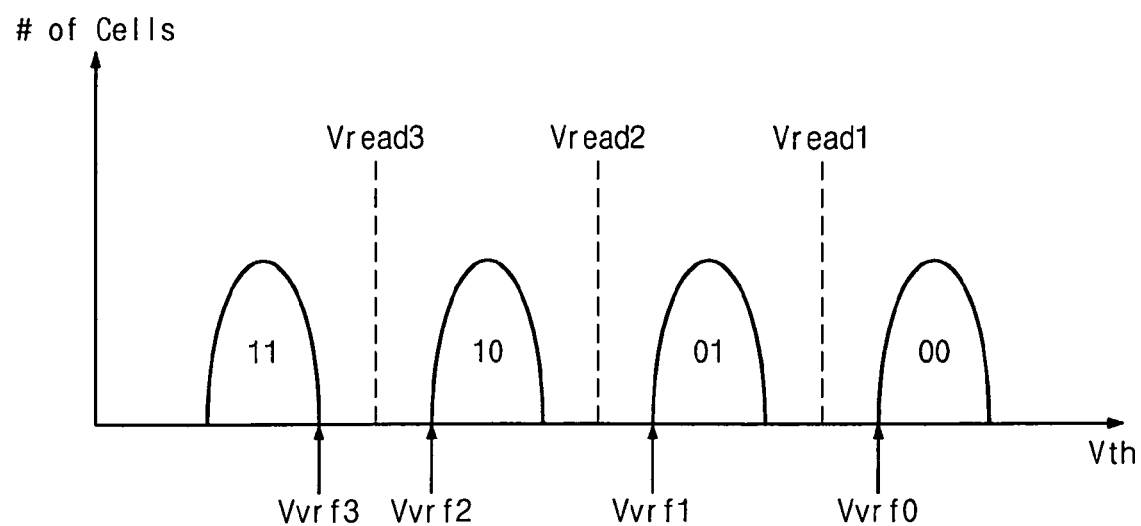
FIG. 1 illustrates threshold voltages of a flash memory cell and distributions of corresponding data.

The voltage Vvrf0 generated from the charge pump 79 may be used as a verify voltage for verifying a program state of data '00' illustrated in FIG. 1. The voltage Vvrf0 is commonly used to generate first to third read voltages Vread1, Vread2, and Vread3 and first to third program verify voltages Vvrf1, Vvrf2, and Vvrf3. The first read voltage Vread1 is used to read data '01' and data '00' illustrated in FIG. 1. The second read voltage Vread2 is used to read data '10' and data '01' illustrated in FIG. 1. The third read voltage Vread3 is used to read data '11' and data '10' illustrated in FIG. 1. The first to third program verify voltages Vvrf1, Vvrf2, and Vvrf3 are used to verify whether a memory cell is programmed to have states '01', '10', and '11', respectively.

A state of the voltage regulator 71 becomes a standby state or an active state depending on whether the enable signal EN generated from the controller 60 is activated. In an exemplary embodiment, a standby period may mean a period where a voltage of a standby state is generated, i.e., the enable signal EN is deactivated, and an active period may mean a period where a voltage of an active state is generated, i.e., the enable signal EN is activated. During the standby state, a program or read operation may not be conducted in the flash memory device 100 and the voltage regulator 71 may generate standby-state read voltages of Vread1, Vread2, and Vread3. The stand-by read voltages Vread1, Vread2, and Vread3 generated from the voltage regulator 71 may not be applied to a wordline and may be just maintained at the standby state. During the active period, a program or read operation may be conducted in the flash memory device 100 and the voltage regulator 71 may generate active-state read voltages of Vread1, Vread2, and Vread3. When an activated verify enable signal VRF_EN is input to the voltage regulator 71 during the active state, the voltage regulator 71 may generate program verify voltages Vvrf1, Vvrf2, and Vvrf3. The generation of the program verify voltages Vvrf1, Vvrf2, and Vvrf3 is generally accomplished by using a high voltage (i.e., Vvrf0) that is also used to generate the read voltages Vread1, Vread2, and Vread3. However, voltage dividing paths for generating the program verify voltages Vvrf1, Vvrf2, and Vvrf3 may be independent of the voltage dividing paths for generating the read voltages Vread1, Vread2, and Vread3, respectively.

In an exemplary embodiment, the voltage regulator 71 may compare its output voltage with a predetermined reference voltage Vref to control the pumping operation of the charge pump 79. Specifically, the voltage regulator 71 may generate first and second control signals TOO_LOW and TOO_HIGH in response to the comparison result. The first control signal TOO_LOW may control an output Vvrf0 of the charge pump 79 that drops below a constant level during a standby period. The second control signal TOO_HIGH may control the output Vvrf0 of the charge pump 79 that drops below a constant level during the active period. The configuration of the voltage regulator will be described below in detail with reference to FIG. 4 and FIG. 5.

The pumping control unit 77 may generate an oscillation enable signal OSC_EN in response to the first and second control signals TOO_LOW and TOO_HIGH generated from the voltage regulator 71. For example, when activated first and second control signals TOO_LOW and TOO_HIGH are generated from the voltage regulator 71, the pumping control unit 77 generates an activated oscillation enable signal OSC_EN. Further, when deactivated first and second control signals TOO_LOW and TOO_HIGH are generated from the voltage regulator 71, the pumping control unit 77 generates deactivated oscillation enable signal OSC_EN. The oscillator 78 may generate a pumping clock signal PUMP_CLK in response to an activated oscillation enable signal OSC_EN.

The charge pump 79 may conduct a charge pumping operation in response to the pumping clock signal PUMP_CLK. A high voltage Vvrf0 is generated as a result of the charge pumping operation. The high voltage Vvrf0 generated from the charge pump 79 may be applied to the voltage regulator 71 to be divided according to a predetermined ratio. The voltage dividing result may be used to control the pumping operation of the charge pump 79 and to generate a plurality of read voltages Vread1, Vread2, and Vread3, and a plurality of program verify voltages Vvrf1, Vvrf2, and Vvrf3. The configuration of the voltage regulator 71 will now be described below in detail.

Figure 4:
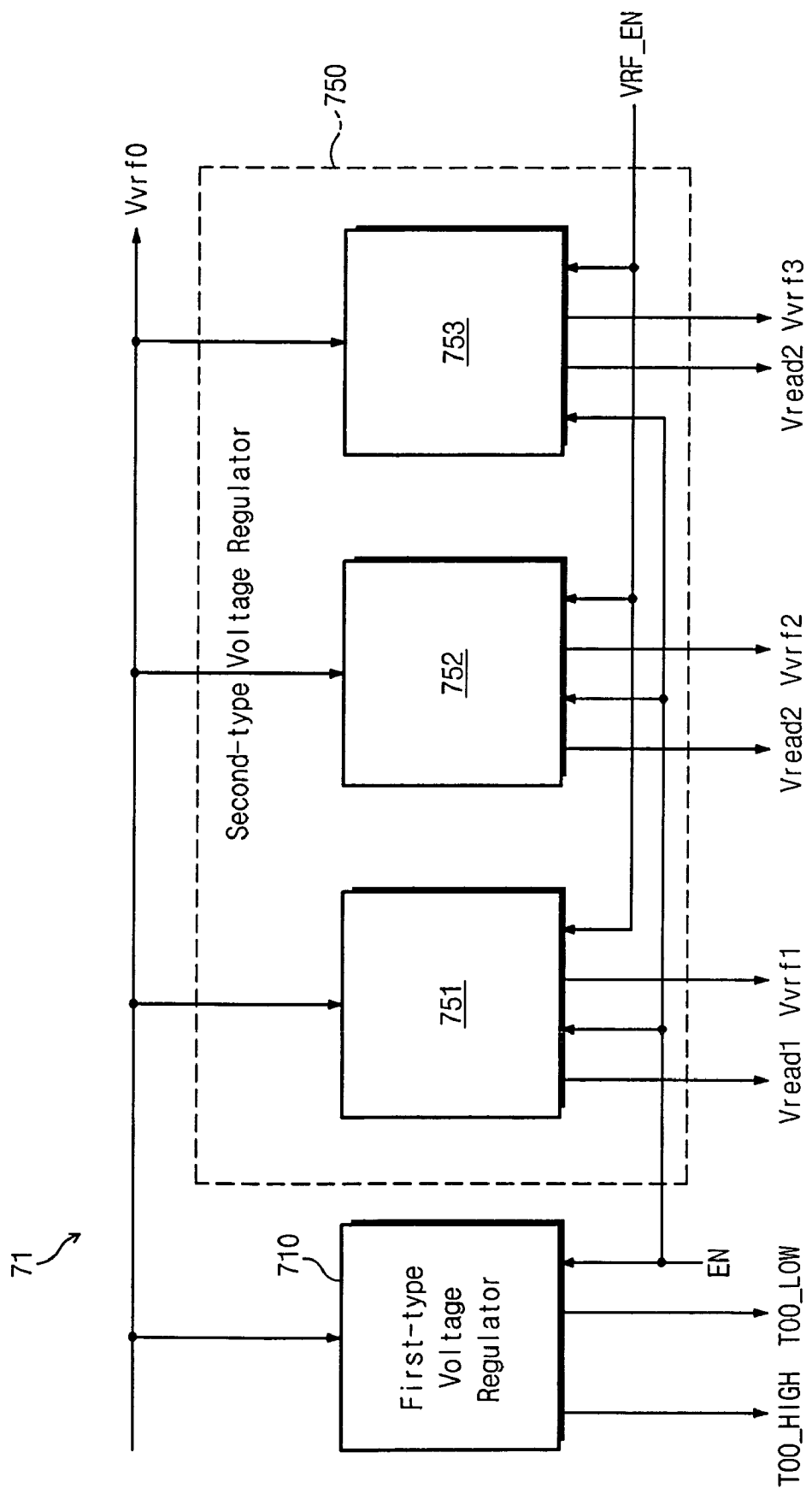
FIG. 4 is a block diagram of a voltage regulator illustrated in FIG. 3 according to an exemplary disclosed embodiment.
Figure 5:
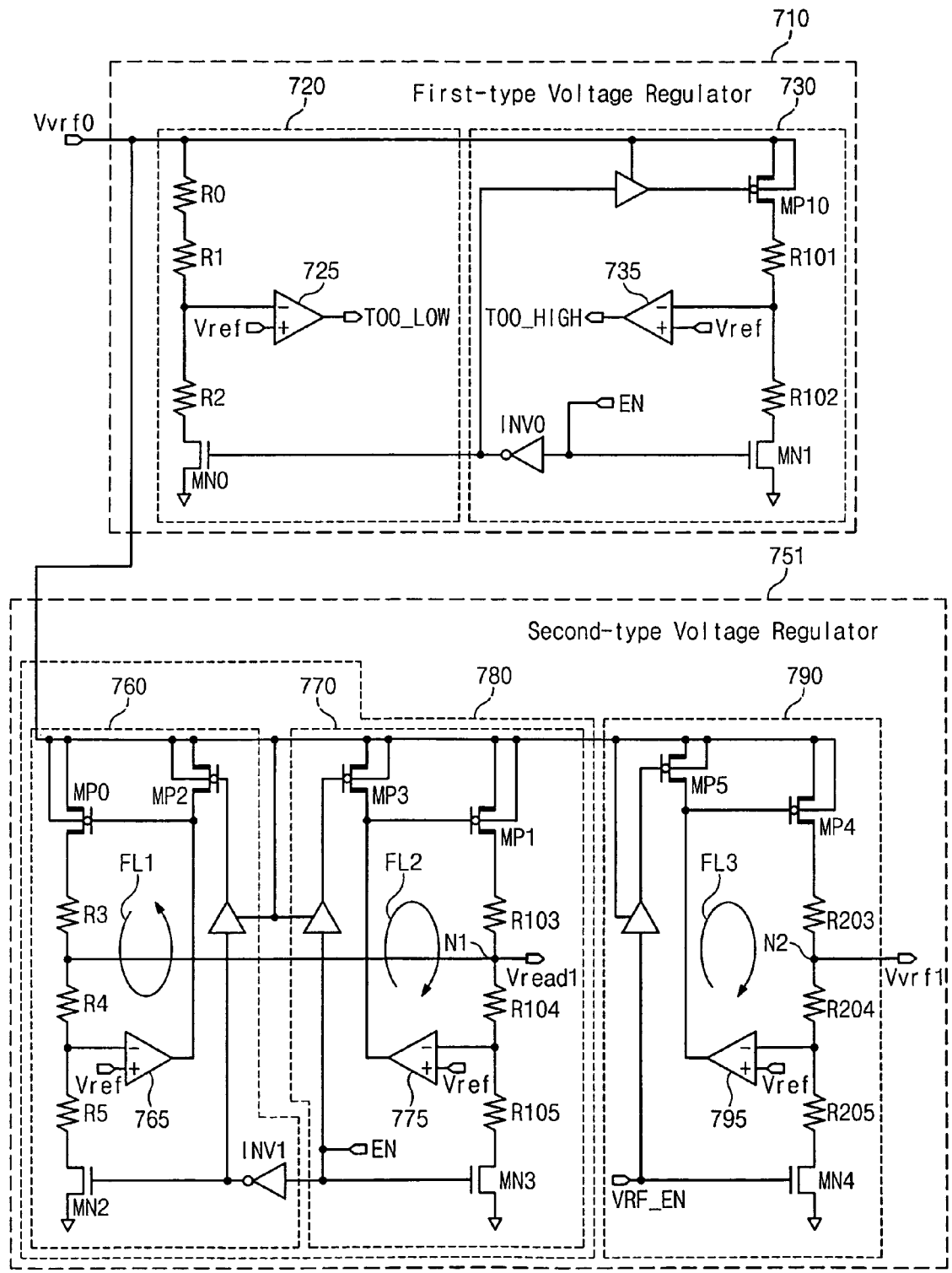
FIG. 5 is a circuit diagram of first-type and second-type voltage regulators illustrated in FIG. 4 according to an exemplary disclosed embodiment.

FIG. 4 shows the detail configuration of the voltage regulator 79 illustrated in FIG. 3. FIG. 5 shows the detailed configuration of first-type and second-type voltage regulators 710 and 750 illustrated in FIG. 4.

Referring to FIG. 4, the voltage regulator 71 includes first-type regulator 710 and a plurality of second-type voltage regulators 750 (comprising 751, 752, and 753). A high voltage Vvrf0 generated from a charge pump 79 may be applied to the first-type voltage regulator 710 and the second-type voltage regulators 750. The first-type voltage regulator 710 may divide the applied high voltage Vvrf0 and may control a charge pumping operation of the charge pump 79 based on the voltage division result. The second-type voltage regulators 750 may divide the applied high voltage Vvrf0 and generate a plurality of constant voltages Vread1, Vread2, Vread3, Vvrf1, Vvrf2, and Vvrf3 based on the voltage division result. The respective second-type voltage regulators 751, 752, and 753 may have the same configuration, but may have different resistance values. The different resistance values may be based on the level of a constant voltage to be generated. In an exemplary embodiment, the respective second-type regulators 751, 752, and 753 may use the same charge pump (79 of FIG. 3) but may generate voltages through independent voltage dividing paths. The independent voltage dividing paths may reduce the effect of charge coupling between generated read and program verify voltages (Vread1, Vvrf1), (Vread2, Vvrf2), and (Vread3, Vvrf3).

Referring to FIG. 5, the first-type voltage regulator 710 may include a first regulating unit 720 and a second regulating unit 730.

The first regulating unit 720 may be activated during a period when the enable signal EN generated from the controller 60 is deactivated (i.e., standby period) to control a pumping operation of a charge pump 79. Specifically, the first regulating unit 720 may divide a high voltage Vvrf0 generated from a charge pump 97 through a plurality of resistors R0, R1, and R2 during the standby period. Thereafter, the first regulating unit 720 may compare the voltage dividing result with a predetermined reference voltage Vref by means of a comparator 725. When the voltage dividing result is lower than the reference voltage Vref, the comparator 725 generates a first control signal TOO_LOW. The charge pump 79 conducts a pumping operation during the period when the first control signal TOO_LOW is generated. As a result, the high voltage Vvrf0 generated from the charge pump 79 may be maintained at a constant level or higher during the standby period.

The second regulating unit 730 may be activated during a period when an enable signal EN generated from the controller 60 is activated (i.e., active period) to control the pumping operation of the charge pump 79. Specifically, the second regulating unit 730 may divide the high voltage Vvrf0 from the charge pump 79 through a plurality of resistors R101 and R102 during the active period. Thereafter, the second regulating unit 730 may compare the voltage dividing result with a predetermined reference voltage Vref by means of a comparator 735. When the voltage dividing result is lower than the reference voltage Vref, the comparator 735 may generate a second control signal TOO_HIGH. The charge pump 79 may conduct a pumping operation during the period when the second control signal TOO_HIGH is generated. As a result, the high voltage Vvrf0 generated from the charge pump 79 may be maintained at a constant level or higher during the active period.

The configuration of the second regulating unit 730 is similar to that of the first regulating unit 720, but resistors R101 and R102 included in the second regulating unit 730 may be configured differently from resistors R0, R1, and R2 included in the second regulating unit 720. For example, the resistors R101 and R102 included in the second regulating unit 730 may be configured to have smaller values than the resistors R0, R1, and R2 included in the first regulating unit 720. As a result, an output of the second regulating unit 730 may have a higher voltage rise speed than an output of the first regulating unit 720.

Now, the configuration of the second-type voltage regulators 750 (comprising 751, 752, and 753) will be described in detail.

In an exemplary embodiment, the second-type voltage regulators 751, 752, and 753 share a charge pump 79 (i.e., a voltage Vvrf0 being a reference voltage when a constant voltage is generated) to generate three pairs of read and program verify voltages (Vread1, Vvrf1), (Vread2, Vvrf2), and (Vread3, Vvrf3), respectively.

Although the configuration of a second-type voltage regulator 751 for generating a first read voltage Vread1 and a first program verify voltage Vvrf1 is illustrated in FIG. 5, it is merely exemplary of one of a plurality of second-type voltage regulators. The difference between second-type voltage regulators 751, 752, and 753 is that the second-type voltage regulators 751, 752, and 753 may have different resistance values. The different resistance values may be based on the level of a voltage to be generated. In other respects, the configuration of the second-type voltage regulators 751, 752, and 753 may be substantially identical to one another.

Figure 6:
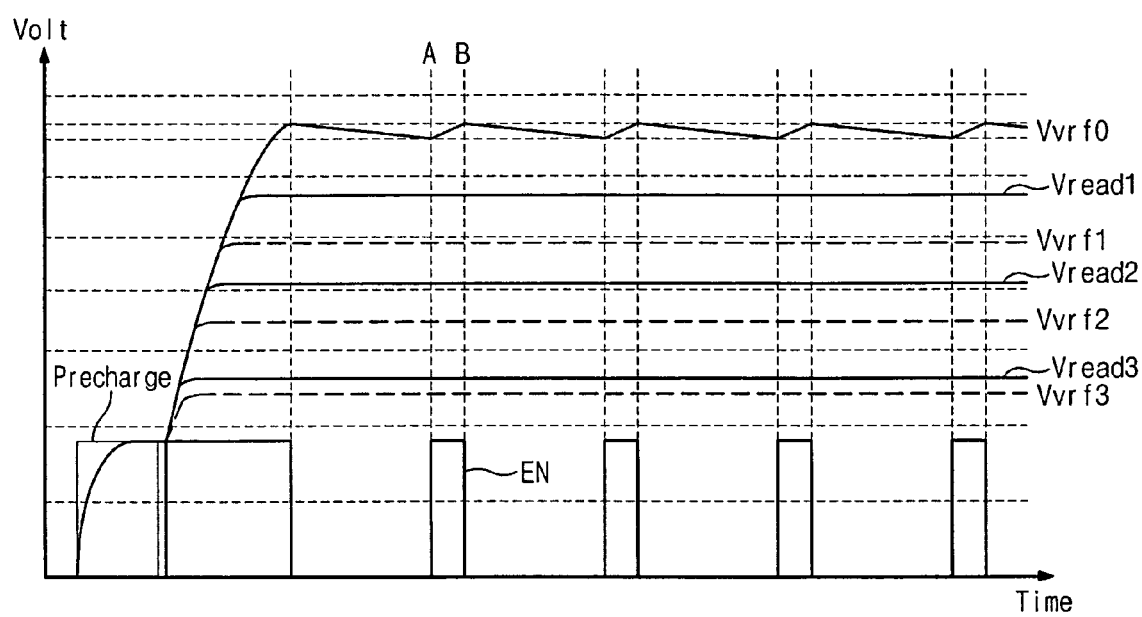
FIG. 6 illustrates levels of read voltages and program verify voltages generated from the voltage generating circuit illustrated in FIG. 2 according to an exemplary disclosed embodiment.

Referring to FIG. 5, the second-type voltage regulator 751 may include a read voltage generating unit 780 and a verify voltage generating circuit 790. The read voltage generating circuit 780 may include a third regulating unit 760 and a fourth regulating unit 770. The third regulating unit 760 may be activated during a standby period to generate a first read voltage Vread1 of a standby state. The fourth regulating unit 770 may be activated during an active period to generate a first read voltage Vread1 of an active state. The levels of read voltages at their respective periods are illustrated in FIG. 6.

The third regulating unit 760 may divide a high voltage Vvrf0 through a plurality of resistors R3, R4, and R5 during a standby period to generate a first read voltage Vread1. A comparator 765 may compare the resulting voltage drop which may be lower than the first read voltage Vread1, with a predetermined reference voltage Vref. When the voltage drop is lower than the reference voltage Vref, a first feedback loop FL1 may be formed in the third regulating unit 760. Until the voltage dividing result reaches a predetermined level, the third regulating unit 760 may iteratively conduct a voltage dividing operation along the first feedback loop FL1. Thus, the first read voltage Vread1 is regulated to a predetermined level. Transistors MP0 and MP2 included in the third regulating unit 760 may be used to form the first feedback loop FL1 in response to the comparison result.

The first voltage Vread1 regulated to the predetermined level by the first feedback loop FL1 may be output to a row selecting unit 30 through a first node N1. At the same time, the first read voltage Vread1 may be provided to a fourth regulating unit 770. The third and fourth regulating units 760 and 770 may share the first node N1 where the first read voltage Vread1 is output. Because the fourth regulating unit 770 is deactivated during a standby period, the first read voltage Vread1 provided from the third regulating unit 760 may charge an output terminal of the fourth regulating unit 770 to a predetermined level. As a result, although an operation mode of the flash memory device 100 changes from a standby mode to an active mode, the first read voltage Vread1 generated from the read voltage generating unit 780 may be directly applied to a wordline without voltage regulation.

During an active period, the fourth regulating unit 770 may divide the high voltage Vvrf0 generated from the charge pump 79 through a plurality of resistors R103, R104, and R105. A first read voltage Vread1 may be generated as the voltage dividing result. A comparator 775 may compare the resulting voltage drop which may be lower than the first read voltage Vread1, with a predetermined reference voltage Vref. When the voltage drop is lower than the reference voltage Vref, a second feedback loop FL2 may be formed at the fourth regulating unit 770. The fourth regulating unit 770 may iteratively conduct a voltage dividing operation along the second feedback loop FL2 until the voltage dividing result reaches a predetermined level. Thus, the first read voltage is regulated to the predetermined level. Transistors MP1 and MP3 included in the fourth regulating unit 770 may used to form the second feedback loop FL2 in response to the comparison result.

The first read voltage Vread1 regulated to have the predetermined level by the second feedback loop FL2 may be output to the row selecting unit 30 and the third regulating unit 760 through the first node N1. During the active period, the first read voltage Vread1 input to the row selecting unit 30 may be applied to a corresponding wordline according to a decoding result of the row selecting unit 30. At the same time, the first read voltage Vread1 may be applied to the third regulating unit 760 to charge an output terminal of the third regulating unit 760 which is in an inactive state to a predetermined level.

The configuration of the verify voltage generating unit 790 for generating a program verify voltage Vvrf1 will now be described below.

The verify voltage generating unit 790 may be activated during an active period. Specifically verify voltage generating unit 790 may be activated during a period where a verify enable signal VRF_EN is active, to generate a first program verify voltage Vvrf1. Levels of voltages Vvrf1, Vvrf2, and Vvrf3 generated from the second-type voltage regulators 751, 752, and 753 are illustrated in FIG. 6, respectively.

The verify voltage generating unit 790 may divide the high voltage Vvrf0 provided from the charge pump 79 through a plurality of resistors R203, R204, and R205 during a period when the verify enable signal VRF_EN is activated. The division of the high voltage Vvrf0 by verify voltage generating unit 790 may result in a first program verify voltage Vvrf1. The comparator 795 may compare the resulting voltage drop which may be lower than the first program verify voltage Vvrf1, with a predetermined reference voltage Vref. When the voltage drop is lower than the reference voltage Vref, a third feedback loop FL3 may be formed at the verify voltage generating unit 790. The verify voltage generating unit 790 may iteratively conduct a voltage dividing operation along the third feedback loop FL3 until the voltage dividing result reaches a predetermined level. Thus, the first program verify voltage Vvrf1 may be regulated to the predetermined level. Transistors MP4 and MP5 included in the verify voltage generating unit 790 may be used to form the third feedback loop FL3 in response to the comparison result.

The first program verify voltage Vvrf1 regulated to the predetermined level by the third feedback loop FL3 may be output to the row selecting unit 30 through a second node N2. Because the first program verify voltage Vvrf1 has a smaller load capacitor element than the first read voltage Vread1, a state of the first program verify voltage Vvrf1 need not be divided into a standby state and an active state.

FIG. 6 shows levels of read voltages Vread1, Vread2, and Vread3, and program verify voltages Vvrf0, Vvrf1, Vvrf2, and Vvrf3, generated from the voltage generating circuit 70 illustrated in FIG. 2. In FIG. 6, dotted lines indicate the levels of the first to third program verify voltages Vvrf1, Vvrf2, and Vvrf3. Periods where the first to third program verify voltages Vvrf1, Vvrf2, and Vvrf3 are practically generated will be described with reference to FIG. 7.

Referring to FIG. 6, each of the program verify voltages Vvrf0, Vvrf1, Vvrf2, and Vvrf3, and the read voltages Vread1, Vread2, and Vread3, have a constant voltage difference between them and are arranged sequentially. The constant voltage difference may be maintained to accurately conduct program verify and read operations. In a case where each of the program verify voltages Vvrf0, Vvrf1, Vvrf2, and Vvrf3, and each of the read voltages Vread1, Vread2, and Vread3, are generated using independent charge pumps, their differences may be mutually independent. In this case, it may be very difficult to regulate the respective voltage levels to have a constant voltage difference. In order to overcome this difficulty, the program verify voltages Vvrf0, Vvrf1, Vvrf2, and Vvrf3, and the read voltages Vread1, Vread2, and Vread3, may be generated by sharing a charge pump 79. As a result, each of the program verify voltages Vvrf0, Vvrf1, Vvrf2, and Vvrf3, and the read voltages Vread1, Vread2, and Vread3, may have a constant voltage difference. Moreover, the resulting circuit configuration may be simplified and the chip size may be reduced. The voltage generating circuit 70 may include multiple voltage dividing paths. Each voltage dividing path may be configured to generate voltages that are mutually independent. Thus, the effect of charge coupling between the program verify voltages Vvrf0, Vvrf1, Vvrf2, and Vvrf3, and the corresponding read voltages Vread1, Vread2, and Vread3, may be weakened. The weakened charge coupling may reduce mutual interference between the read and verify voltages.

Figure 7:
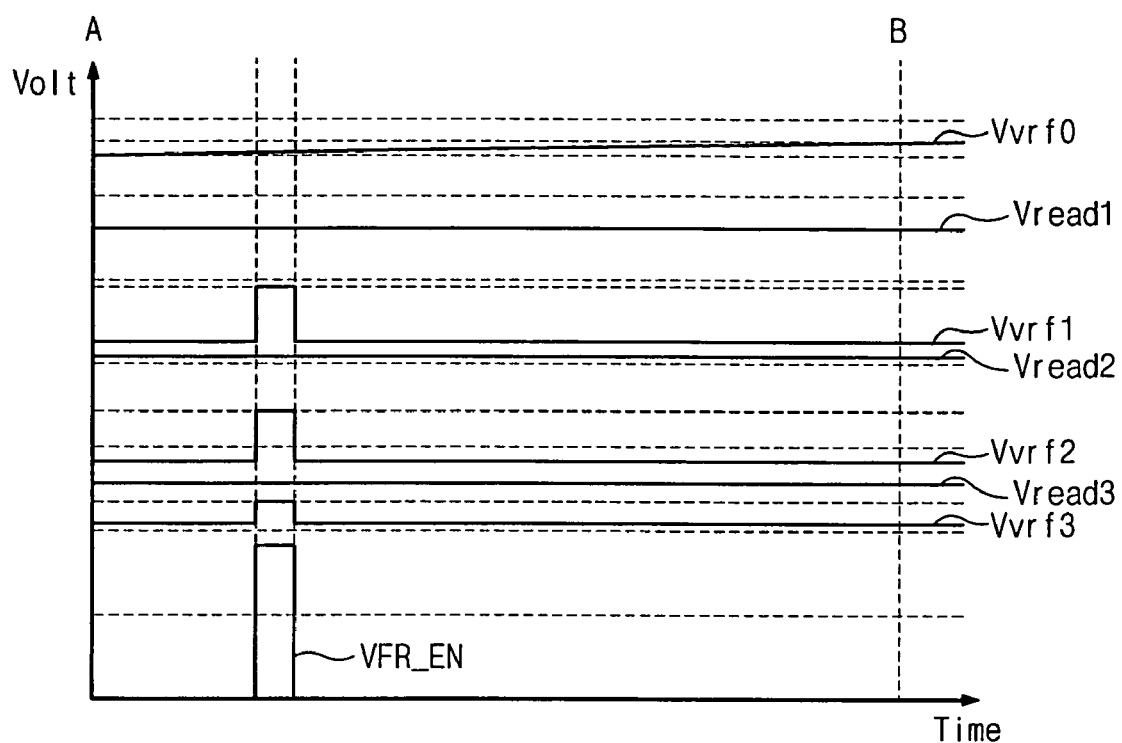
FIG. 7 illustrates an example of generation of first, second, and third program verify voltages illustrated in FIG. 6 according to an exemplary disclosed embodiment.

FIG. 7 illustrates an example of the generation of the first to third program verify voltages Vvrf0, Vvrf1, Vvrf2, and Vvrf3 shown in FIG. 6. Specifically, FIG. 7 illustrates an example of the program verify voltages Vvrf0, Vvrf1, Vvrf2, and Vvrf3 generated during a period "AB" shown in FIG. 6.

Referring to FIG. 7, the voltage generating circuit 70 generates program verify voltages Vvrf1, Vvrf2, and Vvrf3 during an active period. Specifically, the program verify voltages may be generated during a period when a verify enable signal VRF_EN is activated. A reference voltage (i.e., an output of a charge pump) used to generate the program verify voltages Vvrf1, Vvrf2, and Vvrf3 may be identical to a reference voltage used to generate read voltages Vread1, Vread2, and Vread3. Accordingly, setup time and recovery time for the program verify voltages Vvrf1, Vvrf2, and Vvrf3, may not be required. This lack of a setup time may increase the speed of program operation. Furthermore, as mentioned above, second-type voltage regulators 751, 752, and 753 may not generate program verify voltages Vvrf1, Vvrf2, and Vvrf3 during an active period. Instead, they may generate the same only during a period of program verification. Thus, current loss of a charge pump may be reduced.

As explained so far, a plurality of constant voltages required for a flash memory can be provided accurately and stably with a small-sized chip. Thus, a sufficient sensing margin is provided to program and read data stored in the flash memory.

Although the present invention has been described in connection with the exemplary embodiments thereof, it is not limited thereto. It will be apparent to those skilled in the art that various substitutions, modifications and changes may be made thereto without departing from the scope and spirit of the invention. For example, the disclosed system may also be applied to any NAND-type flash memory device that may require stable generation of constant voltages. The disclosed system may also be applied to various non-volatile memory devices such as, for example, MROM (mask ROM), PROM (programmable ROM), EPROM (erasable and programmable PROM), and EEPROM (electrically erasable and programmable ROM).

What is claimed is:

1. A flash memory device comprising:
a memory cell array including a plurality of memory cells; and
a voltage generator which generates a plurality of constant voltages, wherein the voltage generator comprises a plurality of voltage regulators, wherein each voltage regulator is configured to divide a high voltage generated from a charge pump to generate at least two constant voltages having a constant voltage difference therebetween; and
wherein the plurality of voltage regulators have independent voltage dividing paths, wherein each path is configured to generate a separate constant voltage,
wherein each voltage regulator is configured to:
generate a first constant voltage of a standby state during a standby period;
generate a first constant voltage of an active state during an active period; and
selectively generate a second voltage having a constant voltage difference with the first constant voltage of the active state during the active state.

2. The flash memory device of claim 1, wherein the voltage regulators share an output terminal where the first constant voltage of the standby state is output and where the first constant voltage of the active state is output.

3. The flash memory device of claim 2, wherein each of the plurality of voltage regulators forms a first feedback loop which constantly regulates the level of the first constant voltage during the standby period.

4. The flash memory device of claim 3, wherein the first constant voltage regulated during the standby period constantly regulates the level of the first constant voltage of the active state through the shared output terminal.

5. The flash memory device of claim 2, wherein each of the voltage regulators forms a second feedback loop which constantly regulates the level of the first constant voltage during the active period.

6. The flash memory device of claim 5, wherein the first constant voltage regulated during the active period constantly regulates the level of the first constant voltage of the standby state.

7. The flash memory device of claim 1, wherein the first constant voltage is a read voltage which reads data programmed to the memory cell, and the second constant voltage is a program verify voltage which verifies a state of the data programmed to the memory cell.

8. The flash memory device of claim 7, wherein the second constant voltage is generated while a program verify operation is conducted.

9. The flash memory device of claim 7, wherein each of the voltage regulators forms a third feedback loop which constantly regulates the level of the second constant voltage while a program verify operation is conducted.

10. A voltage generating circuit comprising:
a charge pump which generates a voltage higher than a power supply voltage with a charge pumping operation;
a first-type voltage regulator which divides the voltage generated from the charge pump to generate a plurality of control signals;
a plurality of second-type voltage regulators, wherein each of the plurality of voltage generators divides the voltage generated from the charge pump to generate at least two constant voltages having a constant voltage difference therebetween; and
a control circuit which controls the charge pumping operation in response to at least one of the plurality of control signals, wherein the first-type and second-type voltage regulators have independent voltage dividing paths, wherein each path is configured to generate a separate constant voltage
wherein each of the second-type voltage regulators is configured to:
generate a first constant voltage of a standby state during a standby period; generate a first constant voltage of an active state during an active period; and
selectively generate a second voltage having a constant voltage difference with the first constant voltage of the active state during the active state.

11. The voltage generating circuit of claim 10, wherein the second-type voltage regulators share an output terminal where the first constant voltage of the standby state is output and where the first constant voltage of the active state is output.

12. The voltage generating circuit of claim 11, wherein each of the second-type voltage regulators forms a first feedback loop for constantly regulating the level of the first constant voltage during the standby period.

13. The voltage generating circuit of claim 12, wherein the first constant voltage regulated during the standby period is used to constantly regulate the level of the first constant voltage of the active state through the shared output terminal.

14. The voltage generating circuit of claim 11, wherein each of the plurality of voltage regulators forms a second feedback loop which constantly regulates the level of the first constant voltage during the active period.

15. The voltage generating circuit of claim 14, wherein the first constant voltage regulated during the active period constantly regulates the level of the first constant voltage of the standby state.

16. The voltage generating circuit of claim 10, wherein the first constant voltage is a read voltage which reads data programmed to the memory cell, and the second constant voltage is a program verify voltage which verifies a state of the data programmed to the memory cell.

17. The voltage generating circuit of claim 16, wherein the second constant voltage is generated while a program verify operation is conducted.

18. The voltage generating circuit of claim 16, wherein each of the voltage regulators forms a third feedback loop which constantly regulates the level of the second constant voltage while a program verify operation is conducted.

* * * * *